(12) United States Patent
Bangemann et al.

(10) Patent No.: US 11,231,471 B2
(45) Date of Patent: Jan. 25, 2022

(54) NMR ARRANGEMENT AND METHOD FOR TRANSPORTING A SAMPLE TUBE IN AN NMR ARRANGEMENT

(71) Applicant: numares AG, Regensburg (DE)

(72) Inventors: Rico Bangemann, Gera (DE); Andreas Kästner, OT Burkersdorf (DE); Wolf-Dieter Enders, Grossenstein (DE); Lutz Niggl, Waging (DE); Maximilian Zucker, Munich (DE)

(73) Assignee: numares AG, Regensburg (DE)

( * ) Notice: Subject to any disclaimer, the term of this patent is extended or adjusted under 35 U.S.C. 154(b) by 48 days.

(21) Appl. No.: 16/756,514

(22) PCT Filed: Nov. 16, 2018

(86) PCT No.: PCT/EP2018/081489
§ 371 (c)(1),
(2) Date: Apr. 16, 2020

(87) PCT Pub. No.: WO2019/096963
PCT Pub. Date: May 23, 2019

(65) Prior Publication Data
US 2020/0284860 A1    Sep. 10, 2020

(30) Foreign Application Priority Data
Nov. 17, 2017   (DE) .................... 10 2017 220 605.5

(51) Int. Cl.
*G01R 33/30*   (2006.01)
*G01N 35/04*   (2006.01)

(52) U.S. Cl.
CPC ........... *G01R 33/307* (2013.01); *G01N 35/04* (2013.01)

(58) Field of Classification Search
CPC .............................. G01R 33/307; G01N 35/04
See application file for complete search history.

(56) References Cited

U.S. PATENT DOCUMENTS

2002/0063561 A1\* 5/2002 Higgins ............... G01R 33/307
324/318
2010/0156422 A1   6/2010 de Vries et al.

FOREIGN PATENT DOCUMENTS

JP        S6292461 U    6/1987
JP        2006234539 A  9/2006

\* cited by examiner

*Primary Examiner* — Susan S Lee
(74) *Attorney, Agent, or Firm* — The Webb Law Firm

(57) ABSTRACT

Provided is an NMR arrangement, including an NMR device, a storage system for storing sample tubes, and a transport system for transporting the sample tubes from the storage system to the NMR device and from the NMR device to the storage system. The storage system is mechanically decoupled from the NMR device. Furthermore, the transport system includes a first guiding element that is mechanically coupled to the storage system; a second guiding element that is mechanically coupled to the NMR device; and a sample tube carrier that can be moved between the first guiding element and the second guiding element so as to transport the sample tubes from the storage system to the NMR device and from the NMR device to the storage.

17 Claims, 4 Drawing Sheets

NMR ARRANGEMENT AND METHOD FOR TRANSPORTING A SAMPLE TUBE IN AN NMR ARRANGEMENT

CROSS-REFERENCE TO RELATED APPLICATIONS

This application is the United States national phase of International Application No. PCT/EP2018/081489 filed Nov. 16, 2018, and claims priority to German Patent Application No. 10 2017 220 605.5 filed Nov. 17, 2017, the disclosures of which are hereby incorporated by reference in their entirety.

BACKGROUND OF THE INVENTION

Field of the Invention

The disclosure relates to an NMR arrangement and to a method for transporting a sample tube in an NMR arrangement.

Description of Related Art

NMR devices, such as NMR spectrometers, are generally supported in a vibration-cushioned manner. During normal operation of the NMR spectrometer, it can move up to 5 cm around its position of rest. This movement of the NMR spectrometer makes a direct mechanical coupling of a storage system, in which NMR sample tubes that are to be measured are stored, quite difficult. Either the storage system is also supported in a vibration-cushioned manner and coupled to the NMR spectrometer to be able to move together with the NMR spectrometer, or a mechanism needs to be provided to actively compensate for movements of the NMR spectrometer relative to the storage system so as to be able to feed an NMR sample tube to a defined location of the NMR spectrometer.

It is an object underlying the proposed solution to provide an NMR arrangement that facilitates the transport of NMR sample tubes from a storage system to an NMR device and from the NMR device back to the storage system.

This object is achieved with an NMR arrangement having features as described herein. Such an NMR arrangement comprises an NMR device, a storage system for storing sample tubes, and a transport system for transporting the sample tubes from the storage system to the NMR device and from the NMR device to the storage system. This NMR arrangement is characterized in that the storage system is mechanically decoupled from the NMR device. Thus, any movements of the NMR device are not transferred to the storage system. Rather, the NMR device can be supported in a vibration-cushioned manner so as to be movable, whereas the storage system can be supported in a stationary manner. Nonetheless, position changes of the NMR device are automatically compensated without active control (i.e., in a fully passive manner). This is achieved by coupling a first part of the transport system to the storage system and a second part of the transport system to the NMR device. Thereby, both parts of the transport system are not mechanically coupled to each other.

More precisely, the transport system comprises a first guiding element that is mechanically coupled to the storage system. It further comprises a second guiding element that is mechanically coupled to the NMR device. The first guiding element and the second guiding element are mechanically decoupled from each other. The transport system further comprises a sample tube carrier that can be moved between the first guiding element and the second guiding element. In doing so, the sample tube carrier is able to transport sample tubes (typically one sample tube at a time) from the storage system to the NMR device and from the NMR device to the storage system.

The compensation of movements of the position of the spectrometer is achieved by the first guiding element and the second guiding element. More precisely, the first guiding element serves for guiding the sample tube carrier into a first position that is defined with respect to the storage system. Thus, if the sample tube carrier approaches the first guiding element it is guided by the first guiding element to a defined position that is fixed with respect to the storage system. Then, it is particularly easy to load a sample tube from the storage system into the sample tube carrier or to unload a sample tube from the sample tube carrier into the storage system. A sample tube gripper of the storage system only needs to be moved to the defined position in which the sample tube carrier is positioned by the first guiding element so that the gripper does not need to compensate any relative movement of the sample tube carrier or the NMR device.

Likewise, the second guiding element serves for guiding the sample tube carrier into a second position that is defined with respect to the NMR device. Thus, when the sample tube carrier approaches the second guiding element, it is automatically brought into the second defined position. Then, a sample tube gripper that is coupled with the NMR device can easily unload a sample tube from the sample tube carrier and transport it to the measuring zone of the NMR device, such as an NMR bore of an NMR spectrometer. Likewise, such a sample tube gripper of the NMR device can load an already measured sample tube into the sample tube carrier since the sample tube carrier is located in the defined second position due to its previous interaction with the second guiding element. The first guiding element and the second guiding element are purely passive components that guide the sample tube carrier into the first position or the second position, respectively, only by their geometric shape and a compulsory guidance of the sample tube carrier achieved therewith.

In an embodiment, the NMR device is an NMR spectrometer. The sample tubes can also be denoted as NMR sample tubes.

As outlined above, a part of the transport system is coupled to the NMR device, whereas another part is coupled to the storage system. In an embodiment, the part of the transport system that is coupled to the NMR device forms or is a part of an injector of the NMR device. Thereby, the injector can also be able to further transport a sample tube to the NMR measuring zone of the NMR device, such as the NMR bore of an NMR spectrometer. The part of the transport system that is coupled to the storage system is, in an embodiment, a lift that is responsible to move the sample tube carrier from the first guiding element (defining the fixed position of the sample tube carrier with respect to the storage system) to the second guiding element (defining the fixed position of the sample tube carrier with respect to the NMR device), and vice versa.

In an embodiment, the sample tube carrier can be moved in a transport direction between the first guiding element and the second guiding element and in a plane extending perpendicularly to the transport direction. Thereby, the transport direction can be, e.g., a vertical direction, i.e., a direction along the z axis of a Cartesian coordinate system. In such a case, the plane extending perpendicularly to the transport direction is a horizontal plane extending in the x and y direction of the Cartesian coordinate system. The transport system serves for transporting or moving the sample tube carrier along the transport direction. Furthermore, the sample tube carrier is (within defined boundaries) freely movable in the plane extending perpendicularly to the transport direction, e.g., it is laterally movable. If the sample tube carrier is moved along the transport direction from the first guiding element to the second guiding element it is, upon contacting the second guiding element, guided by the second guiding element irrespective of its lateral position into the second position, i.e. into the position that is defined with respect to the NMR device. Likewise, if the sample tube carrier is moved along the transport direction from the second guiding element to the first guiding element, it is, upon contacting the first guiding element, guided by the first guiding element irrespective of its lateral position into the first position, i.e. into the position defined with respect to the storage system.

SUMMARY OF THE INVENTION

In an embodiment, the sample tube carrier is able to be moved with respect to the first guiding element and/or with respect to the second guiding element in at least 3 degrees of freedom. Thereby, the movement is, in an embodiment, a translational movement. In such a case, the 3 degrees of freedom would correspond to the x, y and z directions of a Cartesian coordinate system so that the sample tube carrier would be movable in a vertical direction (in particular by a lift system) and in a plane perpendicular to the vertical direction (in particular by a compulsory guidance by means of the first guiding element and/or the second guiding element).

In an embodiment, the second guiding element comprises a funnel-shaped element. This funnel-shaped element serves for contacting a portion of the sample tube carrier and for (compulsory) guiding the sample tube carrier into the second position. Thereby, the guidance of the sample tube carrier is in particular achieved due to a contact of an interior space of the funnel-shaped element and a portion of the sample tube carrier.

In an embodiment, the funnel-shaped element comprises an inlet opening that can also be denoted as mouth. The inlet opening serves for receiving the portion of the sample tube holder that is intended to get in contact with the funnel-shaped element. Thus, at least that portion of the sample tube holder can be inserted through the inlet opening into the funnel-shaped element. The funnel-shaped element further comprises an outlet opening that can also be denoted as stem. The inlet opening has a first width, and the outlet opening has a second width. Thereby, the second width is smaller than the first width. Thus, if the portion of the sample tube carrier is inserted through the inlet opening into an interior space of the funnel-shaped element, it is guided by the walls of the funnel-shaped element towards the outlet opening. Thereby, the outlet opening defines the second position, i.e., the position that is invariable with respect to the NMR device. Therewith, it is possible for the funnel-shaped element to catch the sample tube carrier irrespective of its concrete lateral orientation and to compulsorily guide it to its outlet opening, i.e. to the second position.

In an embodiment, the funnel-shaped element is arranged such that its inlet opening faces downwards and its outlet opening faces upwards. Then, the sample tube carrier can be inserted through the inlet opening into the funnel-shaped element from a lower side of the funnel-shaped element and can be guided within the funnel-shaped element towards the outlet opening that is arranged, in this embodiment, on the top of the funnel-shaped element.

In an embodiment, the inlet opening and/or the outlet opening have a rectangular ground area, in particular a square ground area. Then, it is possible to build up the funnel-shaped element by four angularly arranged side walls, wherein two side walls in each case are arranged rectangular to each other. In such an embodiment, the funnel-shaped element has the form of a frustum of pyramid. Other shapes of the funnel-shaped element are also possible, e.g., shapes employing a triangular or a circular ground area.

In an embodiment, the portion of the sample tube carrier that is intended to be contacted by the second guiding element so that the sample tube carrier can be guided by the second guiding element is a sample tube holder that extends in the transport direction, in which the sample tube carrier can be moved between the first guiding element and the second guiding element. Thereby the sample tube holder can protrude from the main plane of the sample tube carrier so as to form a protrusion having a length roughly corresponding to the length of a sample tube to be inserted into the sample tube holder.

In an embodiment, the sample tube holder comprises a circular centering element at a terminal section of the sample tube holder. Thereby, this terminal section is distally arranged to the main plane of the sample tube carrier. In this embodiment, the circular centering element is that part of the sample tube holder and the sample tube carrier that, in operation of the NMR arrangement, directly contacts the second guiding element, in particular the interior wall of the funnel-shaped element.

In an embodiment, the circular centering element surrounds a receiving opening through which a sample tube can be inserted into the sample tube holder and through which a sample tube being located within the sample tube holder can be unloaded from the sample tube holder. This embodiment makes a specific alignment of a sample tube received within the sample tube holder with respect to the NMR device particularly easy: the sample tube is located centrally inside the circular centering element. If the circular centering element contacts the second guiding element and is guided by the second guiding element to the second position, then the sample tube located within the sample tube holder of the sample tube carrier is automatically positioned into the second position. It can then be easily gripped, e.g., by an injector system of an NMR spectrometer.

In an embodiment, the first guiding element comprises a first slotted link. This first slotted link serves for engaging a third guiding element that is arranged on the sample tube carrier. Due to this engagement, a compulsory guidance of the sample tube carrier along the first slotted link of the first guiding element is effected. This results in positioning the sample tube carrier in a first direction of a plane extending perpendicularly to a transport direction in which the sample tube carrier can be moved between the first guiding element and the second guiding element.

To allow for an exact positioning of the sample tube carrier by the first guiding element not only in a first direction, but also in a second direction, the first guiding element comprises, in an embodiment, a second slotted link that serves for engaging a fourth guiding element arranged on the sample tube carrier. Due to this engagement, a compulsory guidance of the sample tube carrier in a second direction of the plane extending perpendicularly to the transport direction is effected. Thereby, the second direction extends perpendicularly to the first direction.

In an embodiment, the engagement of the third guiding element and the first slotted link of the first guiding element on the one hand and of the fourth guiding element and the second slotted link of the first guiding element on the other hand serves for positioning the sample tube carrier in the x and y directions of a Cartesian coordinate system into the first position.

An object underlying the proposed solution is also achieved by a method for transporting a sample tube in an NMR arrangement according to the preceding explanations. As outlined above, such an NMR arrangement comprises an NMR device, a storage system for storing sample tubes, and a transport system for transporting the sample tubes from the storage system to the NMR device and from the NMR device to the storage system. Thereby, the storage system is mechanically decoupled from the NMR device. The method comprises the steps explained in the following.

Firstly, the sample tube is transferred from the storage system, in which a plurality of sample tubes are stored, into the sample tube carrier. Thereby, the sample tube carrier is arranged by means of the first guiding element in a first position. The first guiding element is mechanically coupled to the storage system. The first position is a defined position. To be more precisely, it is defined with respect to the storage system. Thus, the first guiding element and therewith the first position are invariable with respect to the storage system.

Afterwards, the sample tube is moved in the sample tube carrier along the transport direction towards the second guiding element. This second guiding element is mechanically coupled to the NMR device.

The second guiding element engages the sample tube carrier such that the sample tube carrier is guided by means of the second guiding element into a second position. Thereby, the second position is also a defined position. More precisely, it is defined with respect to the NMR device. Thus, the second guiding element and therewith the second position are invariable with respect to the NMR device. Any movements of the NMR device result in a movement of the second position. Thus, the relative arrangement between the first guiding element and the second guiding element and therewith between the first position and the second position can change during operation of the NMR arrangement. Nonetheless, the sample tube carrier and therewith a sample tube contained in the sample tube carrier can be moved between the storage system and the NMR device and can safely match the second position through the aid of the second guiding element. Likewise, if the sample tube is moved again back from the NMR device to the storage system, it can safely match the first position by means of the first guiding element. Thus, the first guiding element and the second guiding element compensate for relative movements between the NMR device and the storage system in a passive way by means of compulsory guidance of the sample tube carrier.

In an embodiment, the method comprises an additional step in which the sample tube is gripped by a sample tube gripper of the NMR device. This sample tube gripper can be, in an embodiment, part of an injector system of the NMR device. Gripping of the sample tube takes place after the sample tube carrier has reached the second position. The gripper can then transport the sample tube to an NMR measuring position of an NMR device, such as an NMR bore of an NMR spectrometer.

In an embodiment, the method further comprises an additional step in which the sample tube in the sample tube carrier is moved from the second guiding element along the transport direction towards the first guiding element. Thereby, the sample tube carrier is guided by means of the first guiding element into the first position. For this purpose, the sample tube carrier can, in an embodiment, comprise a third guiding element and/or a fourth guiding element that interact with the first guiding element, e.g., by means of a first slotted link and/or a second slotted link of the first guiding element.

In an embodiment, the transport direction is essentially vertical (i.e., along the z axis of a Cartesian coordinate system). Furthermore, the second guiding element is located in this embodiment beneath the first guiding element. Then, the sample tube carrier is moved upwards if a sample tube is to be transported from the storage system to the NMR device. Likewise, the sample tube carrier is moved downwards if a sample tube is to be transported from the NMR device to the storage system.

All embodiments and variants of the described NMR arrangement can be combined in any desired way and can be transferred to the described method, and vice versa.

BRIEF DESCRIPTION OF THE DRAWINGS

Further details of aspects of the solution will be explained with respect to an exemplary embodiment and accompanying Figures.

DESCRIPTION OF THE INVENTION

Figure 1:
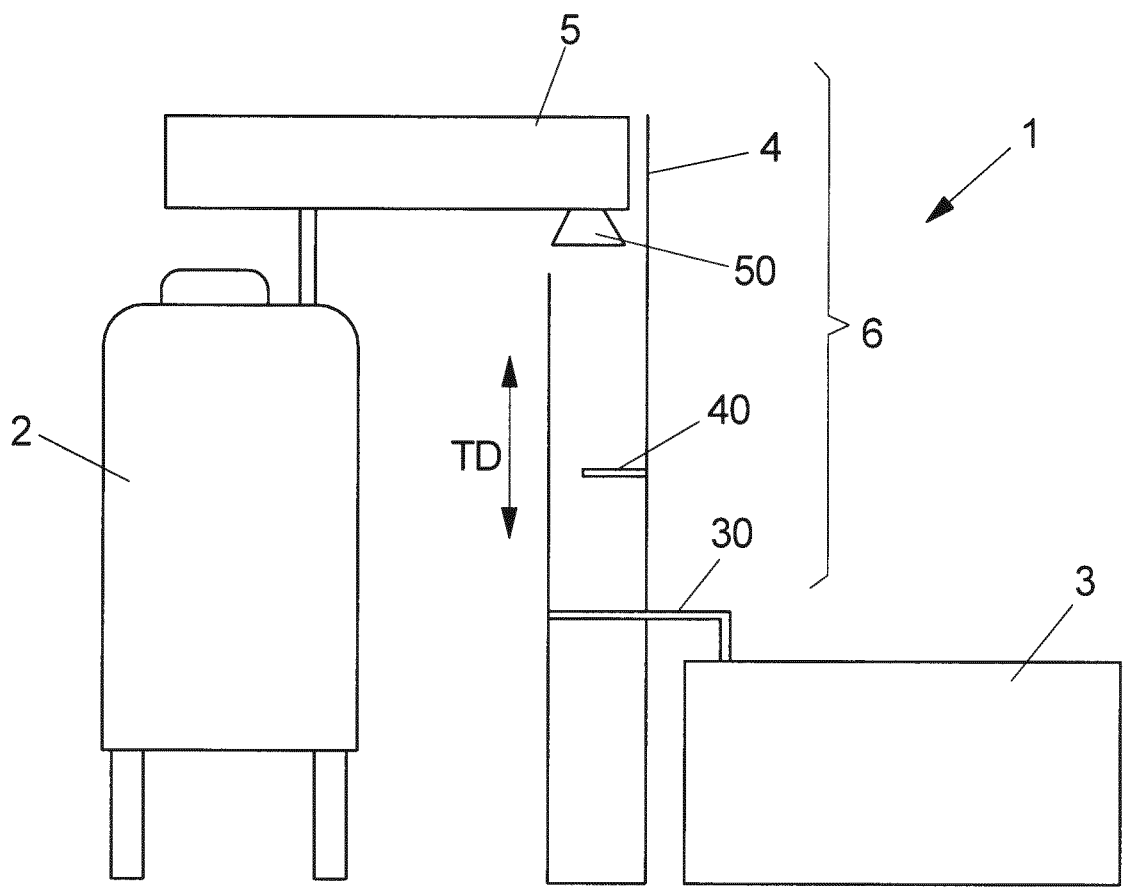
FIG. 1 shows a schematic depiction of an NMR arrangement comprising a transport system.

FIG. 1 shows an Nuclear Magnetic Resonance (NMR) arrangement 1 comprising an NMR spectrometer 2 as NMR device, a storage module 3 as storage system for storing sample tubes, a lift 4 and an injector 5. The lift 4 and the injector 5 are part of a transport system 6 that serves for transporting sample tubes from the storage module 3 to the NMR spectrometer 2 and vice versa.

The transport system 6 further comprises a storage module guidance 30 that is mechanically coupled to the storage module 3 and that serves as first guiding element. The transport 6 system further comprises a sample tube carrier 40 that is part of the lift 4. Furthermore, the transport system 6 comprises an injector guidance 50 that is mechanically connected to the injector 5 and that serves as second guiding element. The sample carrier 40 can be moved between the storage module guidance 30 and the injector guidance 50 along a transport direction TD so as to transport NMR sample tubes from the storage module guidance 30 towards the injector guidance 50 of the injector 5. Thereby, the sample tubes are previously transported to the storage module guidance 30 by a transport mechanism of the sample module 3. The injector 5 then serves for further transporting the sample tubes to the NMR spectrometer 2 so that a sample contained in an according sample tube can be measured in the NMR spectrometer 2.

Figure 2:
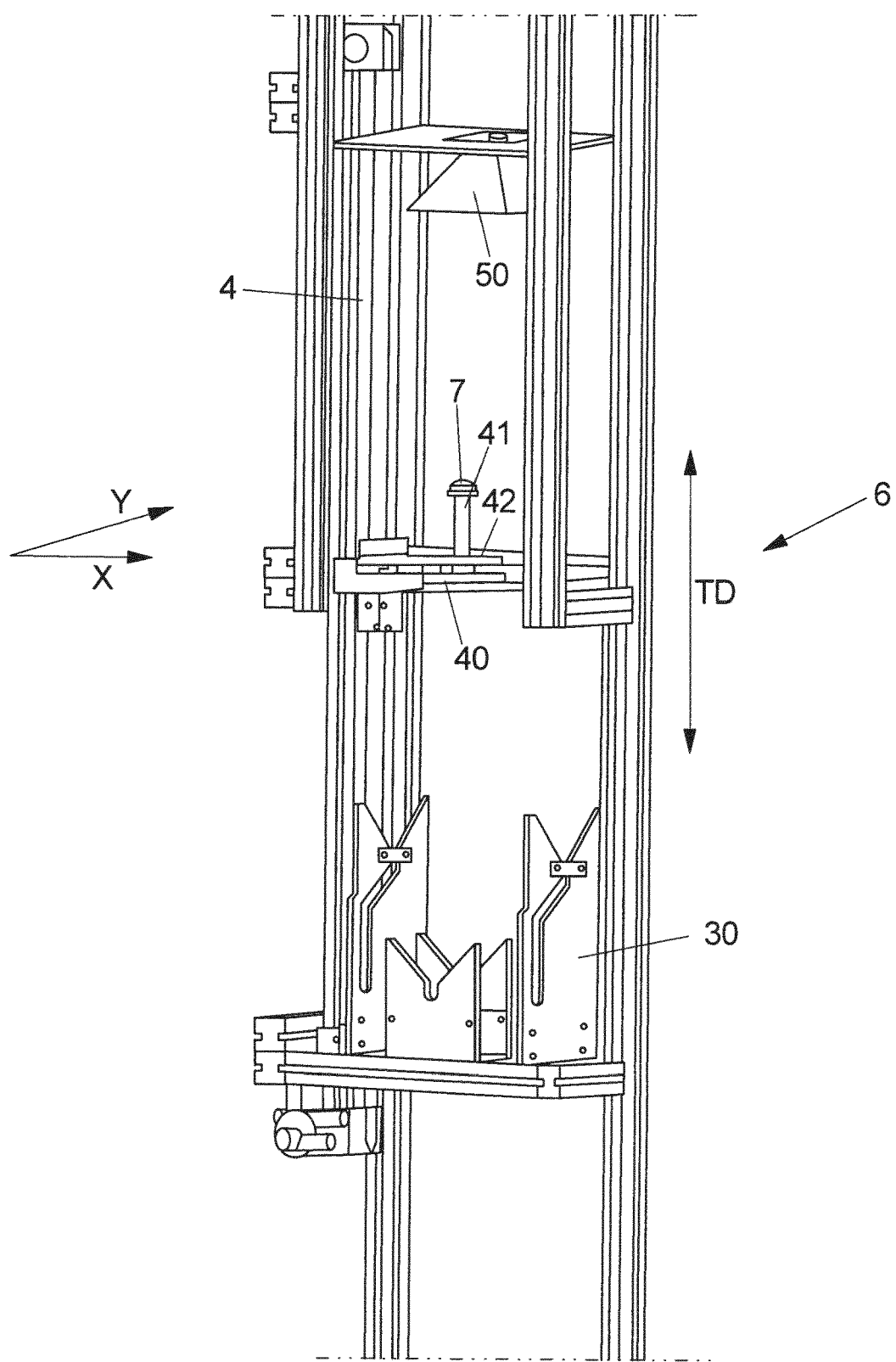
FIG. 2 shows a detail of the transport system of the NMR arrangement of FIG. 1.

FIG. 2 shows a detail of the transport system 6 of FIG. 1, wherein the same or similar elements as in FIG. 1 are identified with the same numeral references. These numeral references will also be used in the following Figures.

As already explained, the sample tube carrier 40 can be moved between the storage module guidance 30 and the injector guidance 50 along the transport direction TD via the lift 4. Additionally, the sample tube carrier 40 is movable in x and y directions of a plane that is perpendicular to the transport direction TD. The transport direction can also be referred to as z direction.

The sample tube carrier 40 comprises a sample tube holder 41 that protrudes from a main plane 42 of the sample tube holder 40 in transport direction TD and has a stem-like appearance. It serves for receiving and transporting a sample tube 7.

While the storage module guidance 30 is tightly connected to the storage module 3 (cf. FIG. 1), the injector guidance 50 is tightly connected to the injector 5 (cf. FIG. 1). The injector 5 itself is connected to the NMR spectrometer 2 (cf. FIG. 1) so that any movements of the NMR spectrometer 2 are transferred to the injector guidance 50. Thus, a relative movement between the injector guidance 50 and the storage module guidance 30 will occur during intended operation of the NMR arrangement.

The transport system 6 guarantees that the sample tube 7 that is received inside the sample tube holder 41 of the sample tube carrier 40 is nonetheless transported by the sample tube carrier 40 both to a defined position with respect to the storage module 3 (cf. FIG. 1) and to the injector 5 (cf. FIG. 1). This will be explained in more detail with respect to the following Figures.

Figure 3:
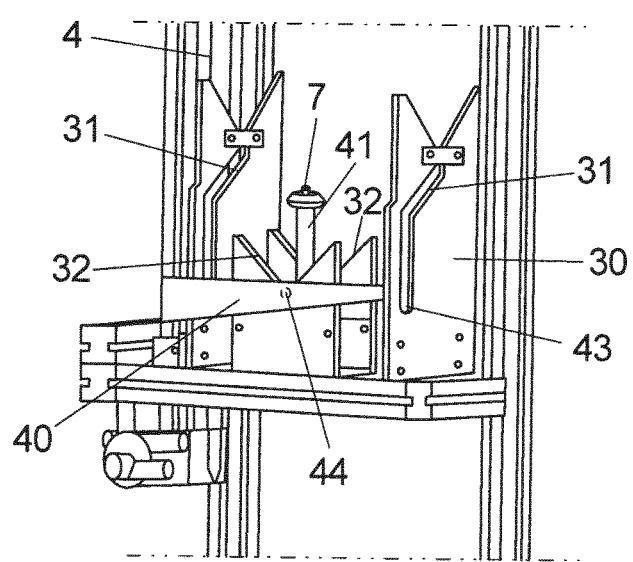
FIG. 3 shows a detailed view of a storage module guidance of the transport system of the NMR arrangement of FIG. 1.

FIG. 3 shows a detailed view of the storage module guidance 30. The storage module guidance 30 comprises a pair of first slotted links 31 and a pair of second slotted links 32. The first slotted links 31 engage a first guiding pin 43 of the sample carrier 40. The second slotted links 32 engage a second guiding pin 44 of the sample tube carrier 40. The first guiding pin 43 serves as third guiding element, whereas the second guiding pin 44 serves as fourth guiding element. By engaging the first guiding pin 43, the first slotted links 31 effect a compulsory guiding of the sample carrier 40 along the y direction. By engaging the second guiding pin 44, the second slotted links 32 serve for a compulsory guiding of the sample carrier 40 in the x direction. Thus, irrespective of the concrete lateral positioning of the sample carrier 40, it will be guided into one specific defined position with respect to the storage module 3 (cf. FIG. 1). This defined position is illustrated in FIG. 3. It is invariable with respect to the storage module 3 so that a gripper of said storage module 3 can easily grip the sample tube 7 received inside the sample tube holder 41 of the sample tube carrier 40.

Figure 4:
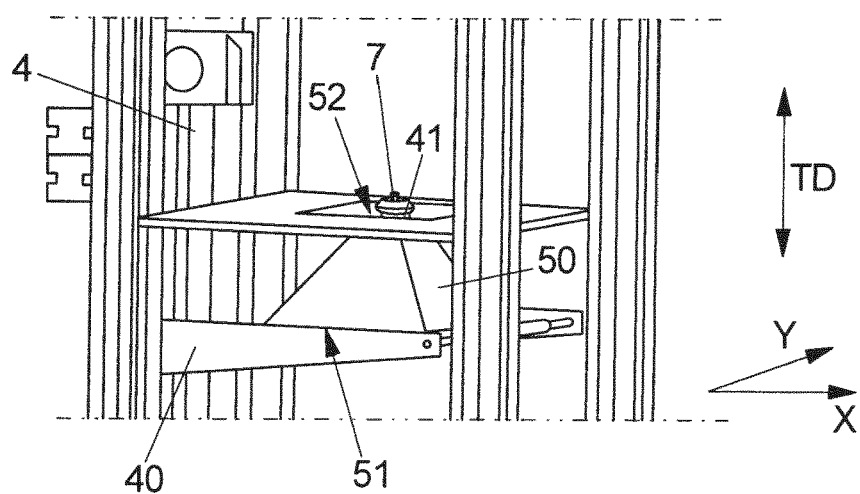
FIG. 4 shows a detailed view of an injector guidance of the transport system of the NMR arrangement of FIG. 1

FIG. 4 shows a detailed view of the injector guidance 50. The injector guidance 50 is a funnel-shaped element; it has the shape of a frustum of pyramid, wherein a bigger inlet opening 51 is arranged on its bottom and a smaller outlet opening 52 is arranged on its top. When the sample tube carrier 40 approaches the injector guidance 50, the sample tube holder 41 gets in contact with an inner surface of the side walls of the funnel-shaped injector guidance 50. Due to the shape of the injector guidance 50, the sample tube holder 41 is automatically guided towards the smaller outlet opening 52 of the injector guidance 50. The lift 4 then stops the movement of the sample carrier 40 in the transport direction TD so that the sample tube 7 can be easily unloaded from the sample tube holder 41 of the sample tube carrier 40 by a gripping mechanism of the injector 5 (cf. FIG. 1). Due to the automatic adjustment of the position of the sample tube carrier 40 in x and y directions by the guidance of the inner surface of the injector guidance 50, the sample tube carrier 40 and therewith the sample tube 7 is always automatically brought into the same defined invariable position with respect to the injector 5 and therewith with the NMR spectrometer.

Figure 5:
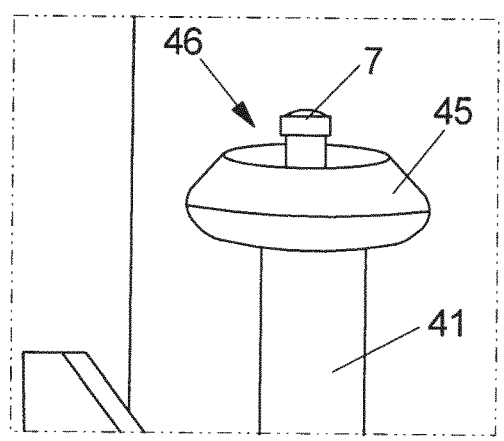
FIG. 5 shows a detailed view of a sample tube holder of the transport system of the NMR arrangement of FIG. 1.

FIG. 5 shows a detail of the distal end of the sample tube holder 41 that is part of the sample tube carrier 40 (cf. FIG. 2). The sample tube holder 41 comprises a receiving opening 45 through which the sample tube 7 can be inserted into the sample tube holder 41. A centering ring 45 is arranged around this receiving opening 46. This centering ring 45 serves as circular centering element. The centering ring 45 gets in direct contact with the inner surface of the side walls of the injector guidance 50 (cf. FIG. 4) if the sample tube holder 41 is moved towards the second position. Thus, the centering ring 45 serves as contact element and allows a smooth sliding along the inner surface of the side walls of the injector guidance 50. The centering ring 45 is made of a low-friction material such as PTFE.

Figure 6:
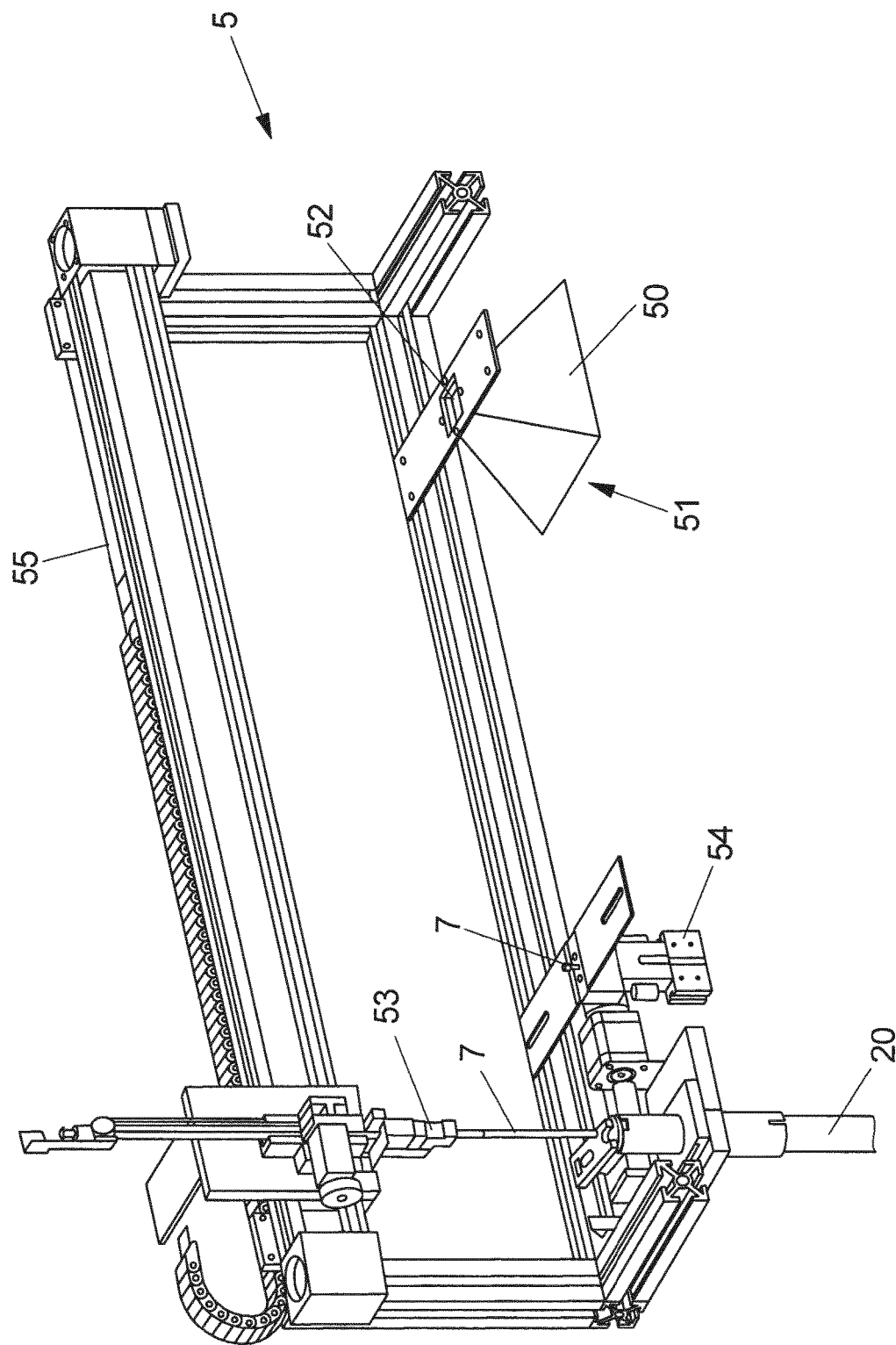
FIG. 6 shows an embodiment of an injector of an NMR arrangement.

FIG. 6 shows a schematic depiction of an exemplary embodiment of the injector 5. The injector 5 comprises, as outlined above, the injector guidance 50 with its bigger inlet opening 51 and its smaller outlet opening 52. It furthermore comprises a gripper 53 that can grip the sample tube 7 and transport it to an NMR bore 20 of the NMR spectrometer 2 (cf. FIG. 1).

When the NMR sample tube 7 is provided to the injector 5 by the sample tube carrier it is automatically guided by means of the injector guidance 50 into a defined invariable position, namely to the center of the outlet opening 52 of the injector guidance 50. The gripper 53 can then easily grip the sample tube 7 and transfer it directly to the NMR bore 20 or to a pre-heater 54 in which the sample tube 7 and therewith a sample contained therein is thermally equilibrated to the desired measuring temperature. To be able to move the gripper 53 between the injector guidance 50 and the NMR bore 20 (or optionally to the pre-heater 54), the gripper 53 is movably mounted on a rail 55 on which it can be moved by means of the motor.

The invention claimed is:

1. An NMR arrangement, comprising an NMR device, a storage system for storing sample tubes, and a transport system for transporting the sample tubes from the storage system to the NMR device and from the NMR device to the storage system,
    wherein the storage system is mechanically decoupled from the NMR device and wherein the transport system comprises: a first guiding element that is mechanically coupled to the storage system, a second guiding element that is mechanically coupled to the NMR device, and a sample tube carrier that can be moved between the first guiding element and the second guiding element so as to transport the sample tubes from the storage system to the NMR device and from the NMR device to the storage system,
    wherein the first guiding element serves for guiding the sample tube carrier into a first position that is defined with respect to the storage system and,
    wherein the second guiding element serves for guiding the sample tube carrier into a second position that is defined with respect to the NMR device.

2. The NMR arrangement according to claim 1, wherein the sample tube carrier can be moved in a transport direction between the first guiding element and the second guiding element and in a plane extending perpendicularly to the transport direction.

3. The NMR arrangement according to claim 1, wherein the sample tube carrier can be moved with respect to the first guiding element and/or with respect to the second guiding element in at least three degrees of freedom.

4. The NMR arrangement according to claim 1, wherein the second guiding element comprises a funnel-shaped element that serves for contacting a portion of the sample tube carrier and for guiding the sample tube carrier into the second position.

5. The NMR arrangement according to claim 4, wherein the funnel-shaped element comprises an inlet opening having a first width, through which the portion of the sample tube carrier can be inserted into the funnel-shaped element, and an outlet opening having a second width, through which a sample tube can be taken from the funnel-shaped element, and wherein the second width is smaller than the first width and wherein the outlet opening defines the second position.

6. The NMR arrangement according to claim 5, wherein the inlet opening and/or the outlet opening have a rectangular ground area.

7. The NMR arrangement according to claim 1, wherein a portion of the sample tube carrier that serves for contacting the second guiding element is a sample tube holder extending in a transport direction in which the sample tube carrier can be moved between the first guiding element and the second guiding element.

8. The NMR arrangement according to claim 7, wherein the sample tube holder comprises a circular centering element at a terminal section distal to a main plane of the sample tube carrier.

9. The NMR arrangement according to claim 8, wherein the circular centering element surrounds a receiving opening through which a sample tube can be inserted into the sample holder.

10. The NMR arrangement according to claim 1, wherein the first guiding element comprises a first slotted link that serves for engaging a third guiding element arranged on the sample tube carrier and for thereby positioning the sample tube carrier in a first direction of a plane extending perpendicularly to a transport direction in which the sample tube carrier can be moved between the first guiding element and the second guiding element.

11. The NMR arrangement according to claim 10, wherein the first guiding element comprises a second slotted link that serves for engaging a forth guiding element arranged on the sample tube carrier and for thereby positioning the sample tube carrier in a second direction of the plane extending perpendicularly to the transport direction, and wherein the second direction extends perpendicularly to the first direction.

12. A method for transporting a sample tube in an NMR arrangement according to claim 1, the NMR arrangement comprising an NMR device, a storage system for storing sample tubes, and a transport system for transporting the sample tubes from the storage system to the NMR device and from the NMR device to the storage system, wherein the storage system is mechanically decoupled from the NMR device and wherein the method comprises the following steps:
transferring a sample tube from the storage system, in which a plurality of sample tubes are stored, into a sample tube carrier, wherein the sample tube carrier is arranged by means of a first guiding element that is mechanically coupled to the storage system in a first position that is defined with respect to the storage system,
moving the sample tube in the sample tube carrier along a transport direction towards a second guiding element that is mechanically coupled to the NMR device, and
guiding the sample tube carrier by means of the second guiding element into a second position that is defined with respect to the NMR device.

13. The method according to claim 12, further comprising an additional step in which the sample tube is gripped by a sample tube gripper of the NMR device after the sample tube carrier has reached the second position and is transported by the sample tube gripper to an NMR measuring position of the NMR device.

14. The method according to claim 12, further comprising an additional step in which the sample tube in the sample tube carrier is moved from the second guiding element along the transport direction towards the first guiding element, wherein the sample tube carrier is guided by means of the first guiding element into the first position.

15. The method according to claim 14, wherein the transport direction is essentially vertical and in that the second guiding element is located above the first guiding element.

16. The method according to claim 13, further comprising an additional step in which the sample tube in the sample tube carrier is moved from the second guiding element along the transport direction towards the first guiding element, wherein the sample tube carrier is guided by means of the first guiding element into the first position.

17. The method according to claim 16, wherein the transport direction is essentially vertical and in that the second guiding element is located above the first guiding element.

* * * * *